United States Patent [19]

Thaxter

[11] 4,360,273
[45] Nov. 23, 1982

[54] OPTICAL ALIGNMENT OF MASKS FOR X-RAY LITHOGRAPHY

[75] Inventor: James B. Thaxter, Townsend, Mass.

[73] Assignee: Sperry Corporation, New York, N.Y.

[21] Appl. No.: 121,350

[22] Filed: Feb. 14, 1980

[51] Int. Cl.³ .................................. G01B 9/02
[52] U.S. Cl. ........................ 356/354; 356/363; 356/401; 350/162 ZP
[58] Field of Search ............ 356/354, 355, 356, 363, 356/153, 154, 399, 400, 401; 350/162 ZP

[56] References Cited

U.S. PATENT DOCUMENTS

| | | | |
|---|---|---|---|
| 4,037,969 | 7/1977 | Feldman et al. | 356/401 |
| 4,113,388 | 9/1978 | Gates et al. | 356/354 X |
| 4,200,395 | 4/1980 | Smith et al. | 356/356 |
| 4,211,489 | 7/1980 | Kleinknecht et al. | 356/356 X |
| 4,265,542 | 5/1981 | Snow | 356/356 |

Primary Examiner—Vincent P. McGraw
Assistant Examiner—Matthew W. Koren
Attorney, Agent, or Firm—Howard P. Terry

[57] ABSTRACT

Optical alignment of the relative positions of cooperating masks and substrates is achieved for use in the generation by x-radiation of complex and compact patterns. Small fiduciary marks are actually illuminated by coherent visible light and the resultant diffraction patterns are used for alignment purposes. Fresnel half-period zone plates are used to produce interference patterns in the form of an operator-observable information bearing pattern on a viewable screen.

9 Claims, 14 Drawing Figures

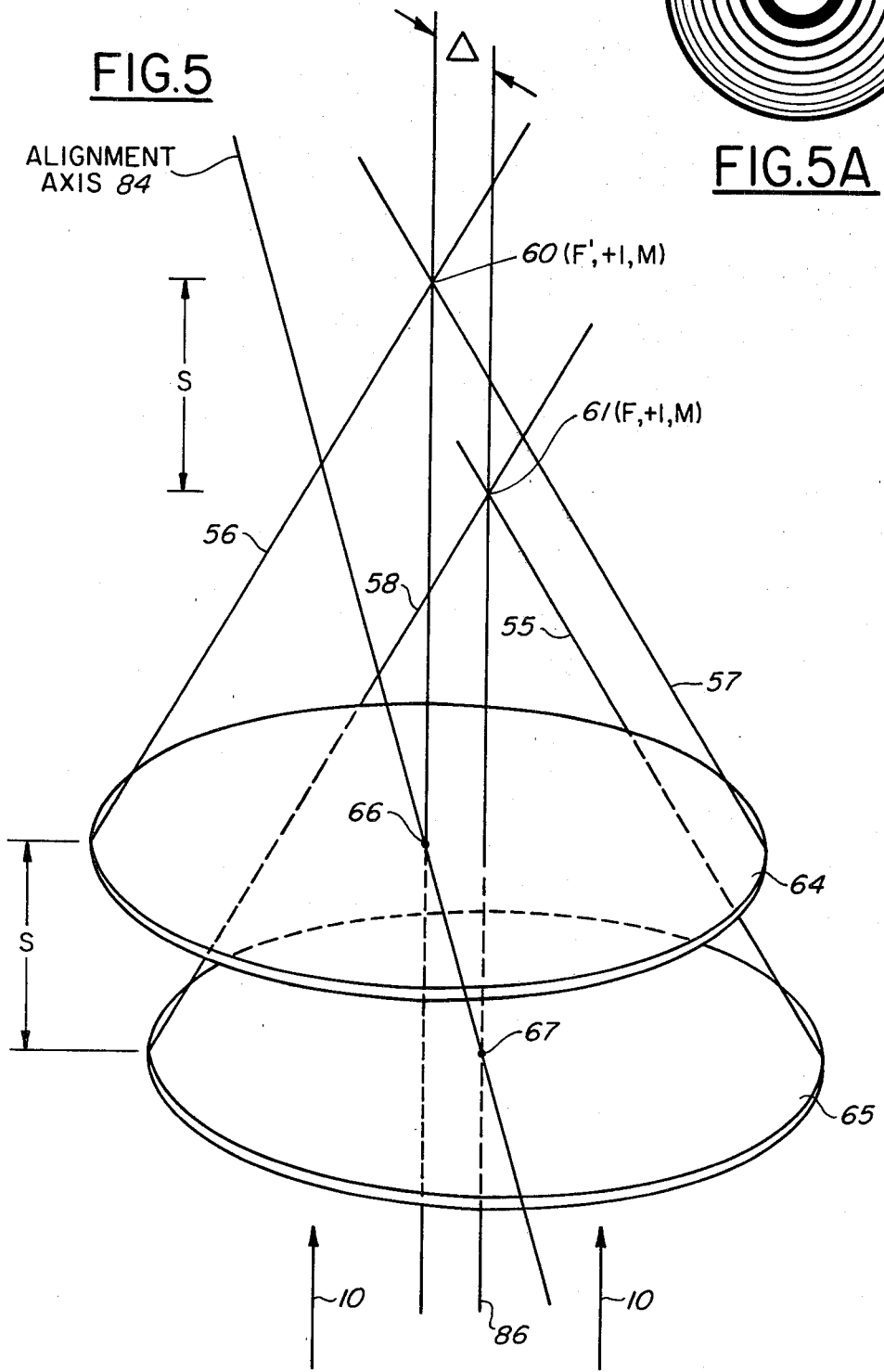
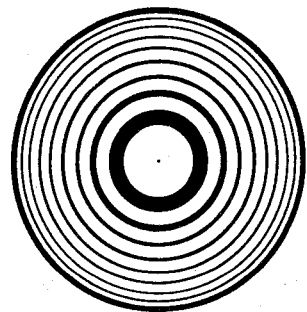
FIG.5
FIG.5A

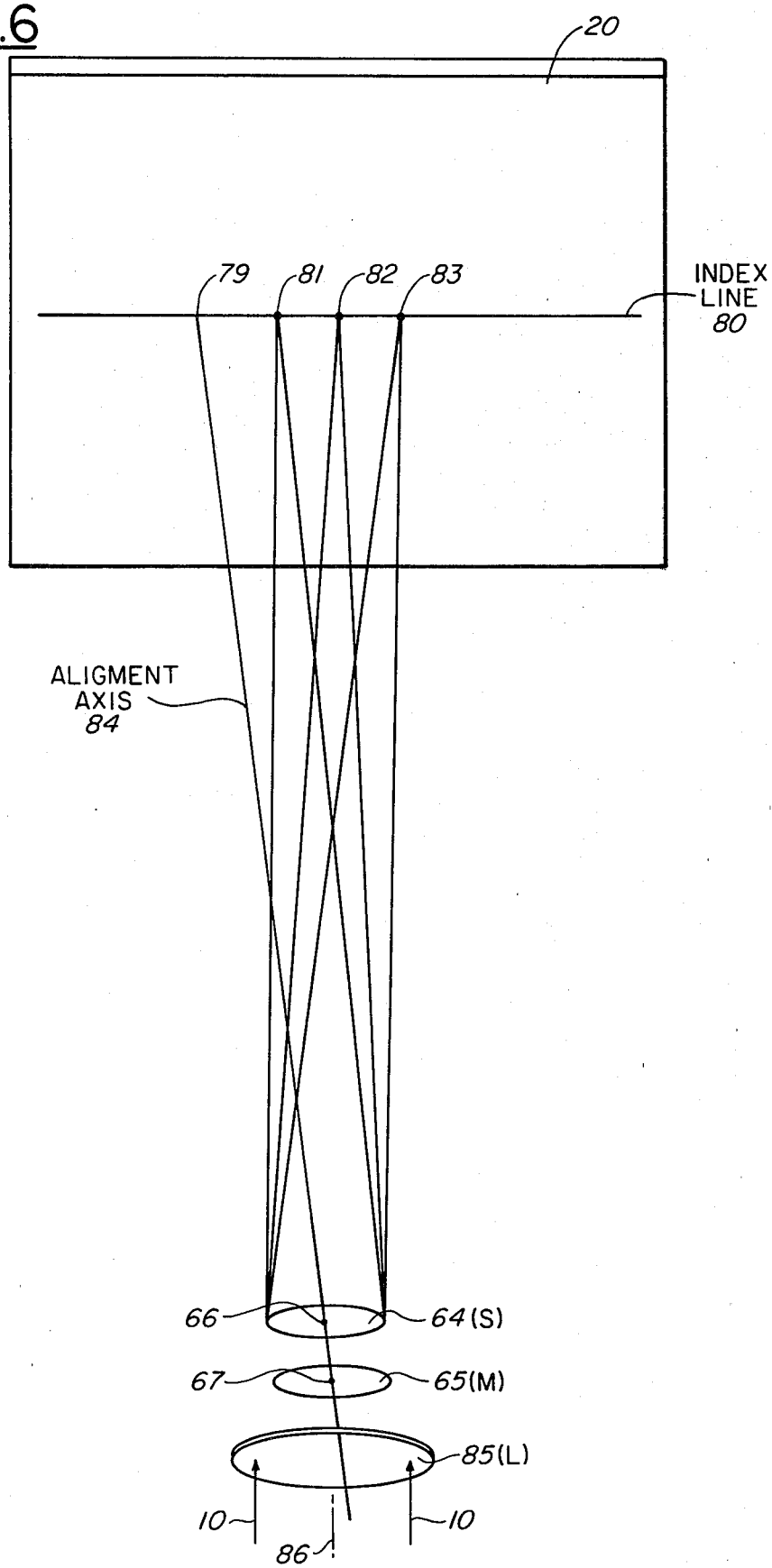

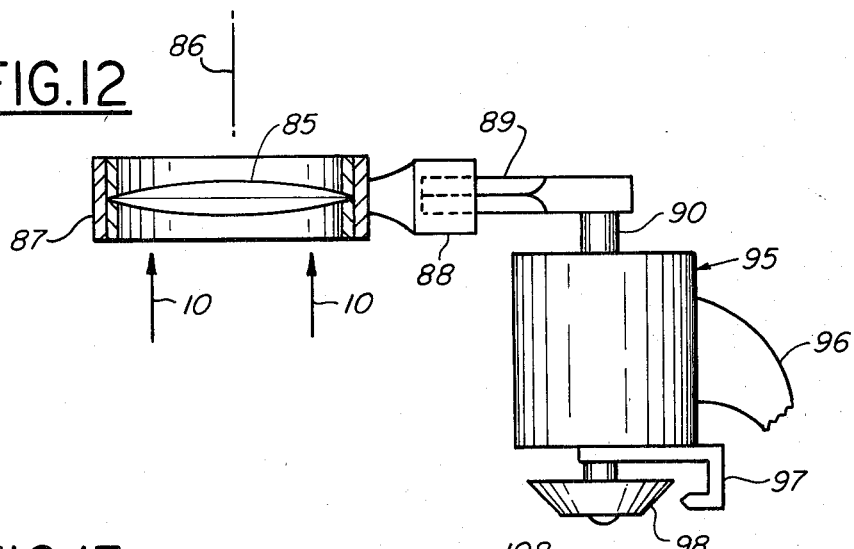
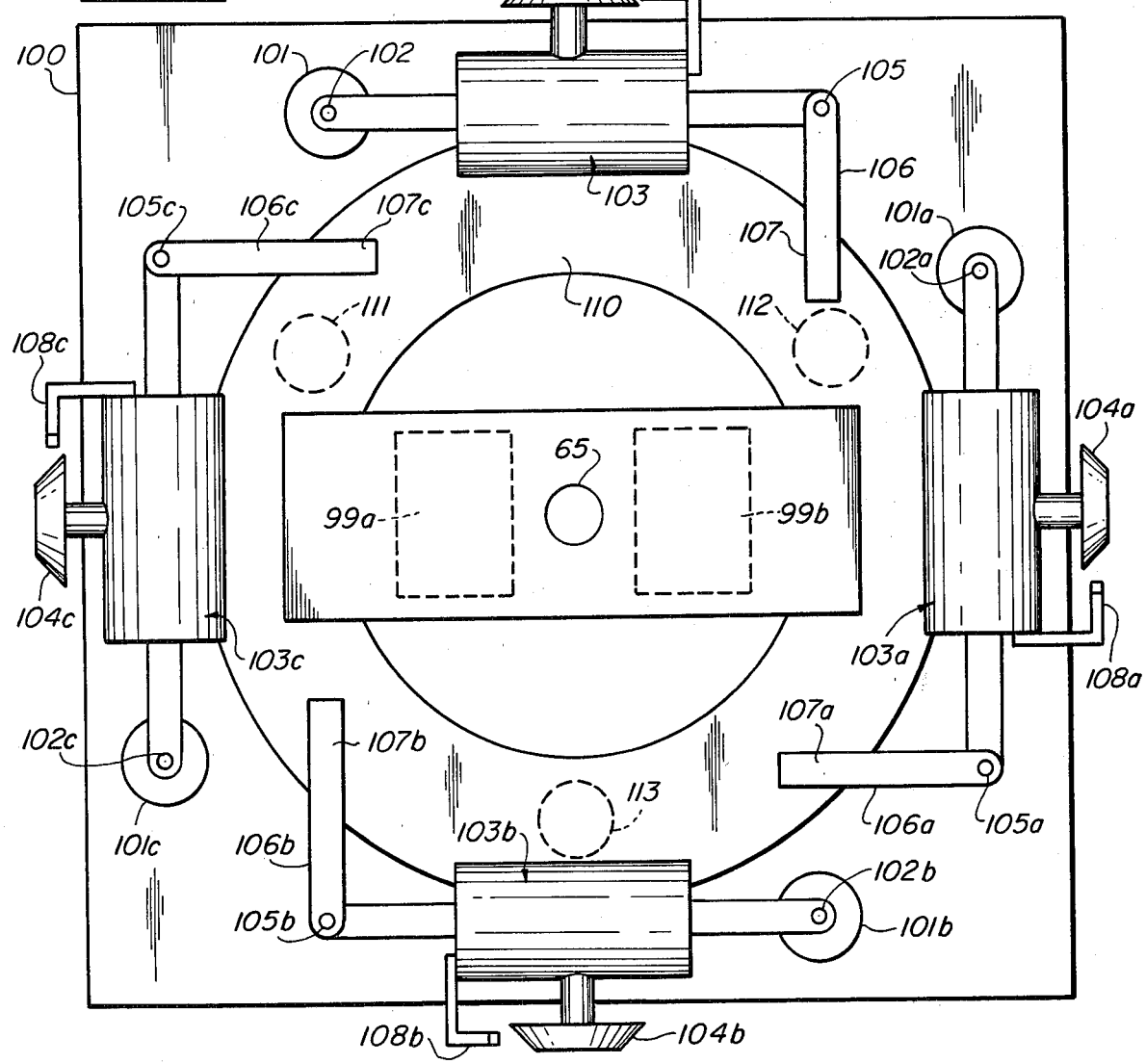

OPTICAL ALIGNMENT OF MASKS FOR X-RAY LITHOGRAPHY

BACKGROUND OF THE INVENTION

1. Field of the Invention

The invention pertains to the art of optical positional alignment of x-ray lithography masks using Fresnel half-period zone plates or the like and, more particularly, concerns accurate optical alignment of precise x-ray lithographic masks with cooperating substrates in the fabrication of integrated semiconductor circuits, compact magnetic domain devices, and the like.

2. Description of the Prior Art

Optically exposed microlithographic masks used to fabricate dense, complex, and compact patterns such as those of integrated circuits, magnetic domain devices, and the like which have four to six micron features are readily aligned by prior art optical means, such as the conventional visible light split-image microscope. However, desirable precision mask preparation methods using x-radiation lithography are about ready for introduction, and these advanced methods will increase the precision of mask feature dimension recognition to one micron or less. The prior art optical alignment techniques that conveniently use visible light fail totally when used with fiduciary marks of similar dimensions due to loss by diffraction.

SUMMARY OF THE INVENTION

The invention pertains to the visual optical alignment of the relative positions of cooperating masks and substrates employed in the generation by x-radiation of complex and compact patterns. According to the new arrangement, small fiduciary marks are actually illuminated by coherent visible light and properties inherent in the consequent diffraction patterns are used beneficially for alignment purposes without actual imaging of the masks. Efficient use is made of the diffracted light by employing optical arrays such as Fresnel half-period zone plates. The zone plates efficiently utilize light to create real and virtual coherent point sources near the mask and the substrate planes, which sources cause interference to produce an operator-observable information-bearing pattern on a screen.

The novel alignment scheme is unambiguous and inherently substantially tolerant to mask-to-substrate separation with improved alignment accuracy by indication of absolute position. Furthermore, the method is adaptable to the use of multiple level masks for producing multi-level circuits. Further attributes of the invention and other advantages over the prior art will be discussed in the following.

BRIEF DESCRIPTION OF THE DRAWINGS

FIG. 5 is an enlarged view of a portion of FIG. 4.

FIG. 5A is a plan view of the face of a zone plate as employed in the present invention.

FIG. 6 is a diagramatic representation including parts of FIGS. 4 and 5 explaining a first mode of operation of the invention.

FIG. 12 is an elevation view of a mechanism for moving the lens 85 substantially along the vertical or z axis.

FIG. 13 is a plan view of apparatus for translating zone plate 65 and mask 99 substantially along horizontal x or y axes or for rotating them in azimuth $\theta$ substantially about the z or vertical axis.

DESCRIPTION OF THE PREFERRED EMBODIMENTS

GENERAL

A successful lithographic process for affording precise reproductions of patterned masks is needed for the fabrication of more complex and increasingly dense integrated semiconductor circuits, surface wave acoustic devices, magnetic domain digital processor devices, and the like. At the present time, transfer of a given mask pattern to a substrate structure is being done with x-rays to an accuracy replicating the accuracy of the mask itself of about 0.1 microns. Evidently, if this capability of high resolution with x-radiation is to be successfully exploited, the succession of patterned masks to be used in such a fabrication process must each be aligned and successively overlaid with respect to the substrate with the same degree of accuracy; i.e., the alignment or registration accuracy must always be about 0.1 microns.

As noted in the foregoing discussion, the alignment or registration problem has not been resolved using past techniques, such as those using cooperating optical imaging of fiducial marks placed on the mask and on the substrate. The basic problem defeating prior optical techniques is concerned with pronounced diffraction effects associated with the necessarily small index marks used for the alignment purpose. Use of visible light with the small marks in the alignment process causes severe diffraction scatter of light, producing poorly defined images and, thus, resulting in inaccurate registration. The present invention avoids any attempt to form an image of the alignment mark and, instead, makes ingeneous use of the diffraction pattern itself.

Figure 1:
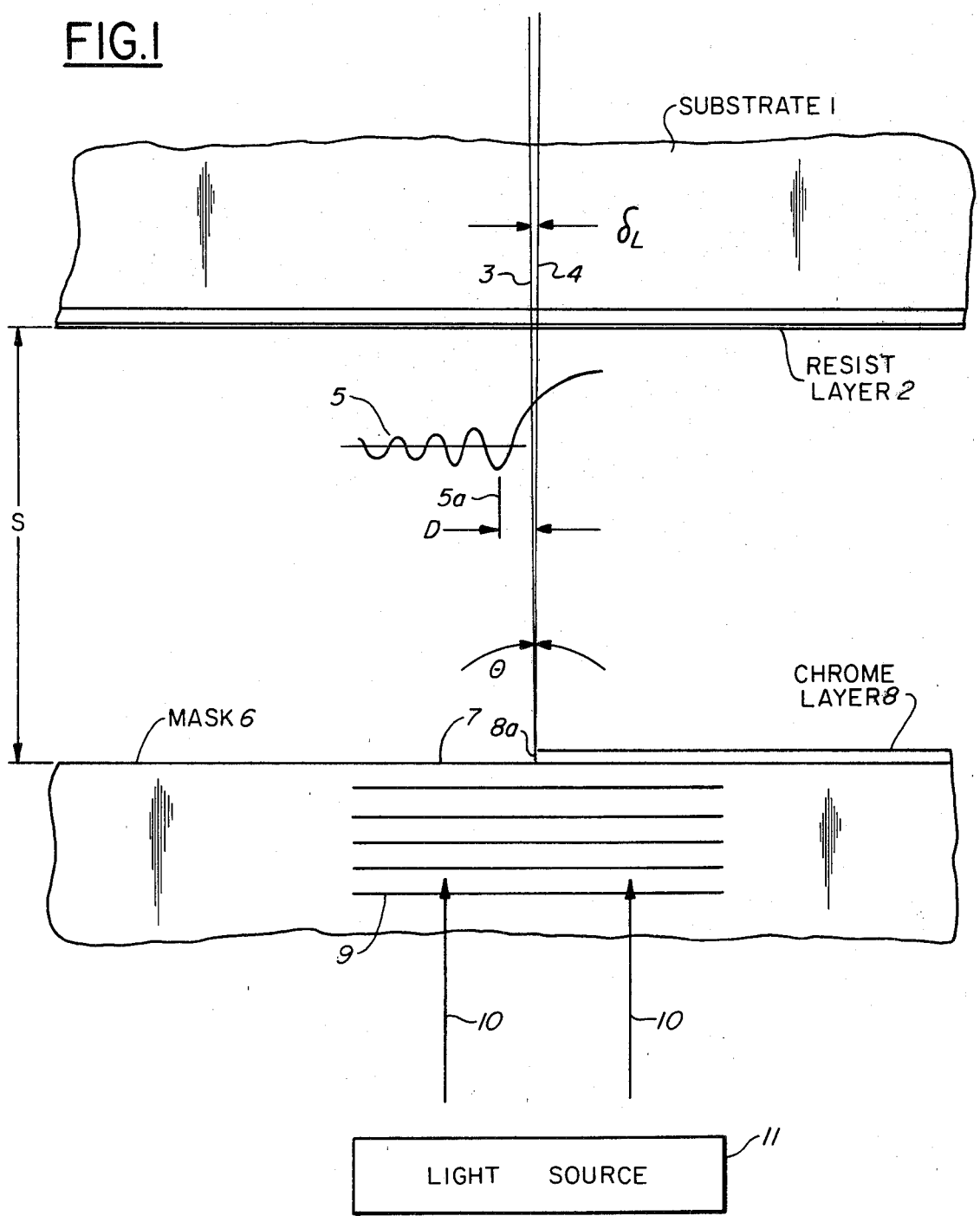
FIG. 1 is a diagramatic representation useful in explaining the prior art.

The high resolution capacity that is characteristic of x-ray lithography originates in the fact that x-radiation produces only a small degree of diffraction and, hence, the mask edge shadows on the substrate are desirably relatively sharp, the scale of the diffraction effects being significantly reduced with respect to the diffraction effects for visible radiation. For example, FIG. 1 shows in exaggerated proportions a coherent visible light ray 9, 10 of wave length $\lambda$ moving through a mask 6 having an edge 8a of a masking pattern formed by a chromium layer 8 on surface 7. At a distance S above surface 7 is a substrate 1 supporting a conventional resist layer 2. The mask edge 8a may be illuminated by such a light beam with $\lambda = 0.5$ microns, for example. The curve 5 shows the positions of the successive peaks in the light intensity profile at arbitrary distances from edge 8a; the horizontal positions of these peaks is, of course, wave length dependent. If a typical multiple frequency wave band in the ultra-violet is used, the maxima tend to smear and become indistinct, though the gradual trailing off of the light intensity will be readily distinguishable. The distance of the first maximum at 5a with respect to the vertical line 4 from edge 8a is a measure of the realizable index mark resolution. The relation of distance D to the separation S between mask 6 and resist layer 2 and wave length λ for collimated radiation is:

$$D = 0.85(s\lambda)^{\frac{1}{2}} \tag{1}$$

For x-rays of wave length only $10^{-3}$ times as great as that of visible light and in the same geometry as FIG. 1, the value of D would be about 0.1 microns, even for a large separation S of about 30 microns. For such an x-ray exposure of the resist layer 2, mask 6 would be brought substantially into contact with the resist face of substrate 1; in reality "substantially in contact" in this case means that S is 3 microns or less. The corresponding value of D according to equation (1) would be about 0.03 microns, thereby making possible a 0.1 micron resolution in the x-ray lithographic method.

X-rays, where actually used to produce precise replication, have been proposed for use for mask alignment as well, for example, as discussed by John H. McCoy and P. A. Sullivan in the technical paper "Mask Alignment for the Fabrication of Integrated Circuits Using X-ray Lithography", *Solid State Technology*, September 1976, pages 59 through 64. However, proposed x-ray alignment schemes thus far investigated have not met with complete success because of the lack of collimating lenses and of adequate image detectors useful at x-ray wave lengths. Furthermore, x-ray alignment techniques also require that the substrate be transparent in the transmission mode or, in reflection, the alignment markers of the substrate must be fluorescent because reflection of x-radiation in the instance of small angle incidence is not efficient. At best, the x-ray alignment systems so far implemented are cumbersome and have not been shown to be practical methods yielding accurate alignment.

Essentially standard optical methods have also been proposed for use in x-ray lithography; these optical methods use conventional microscopes to align the magnified images of small fiducial marks placed on mask and substrate surfaces. However, such methods yield results complicated by parallax, small depth of field, and short working distances, plus the need for a plurality of high quality microscope optics operating at widely different focal ranges. These problems severely limit the untility of the optical microscope approach to D alignment values of ±0.5 microns (FIG. 1).

Figure 2:
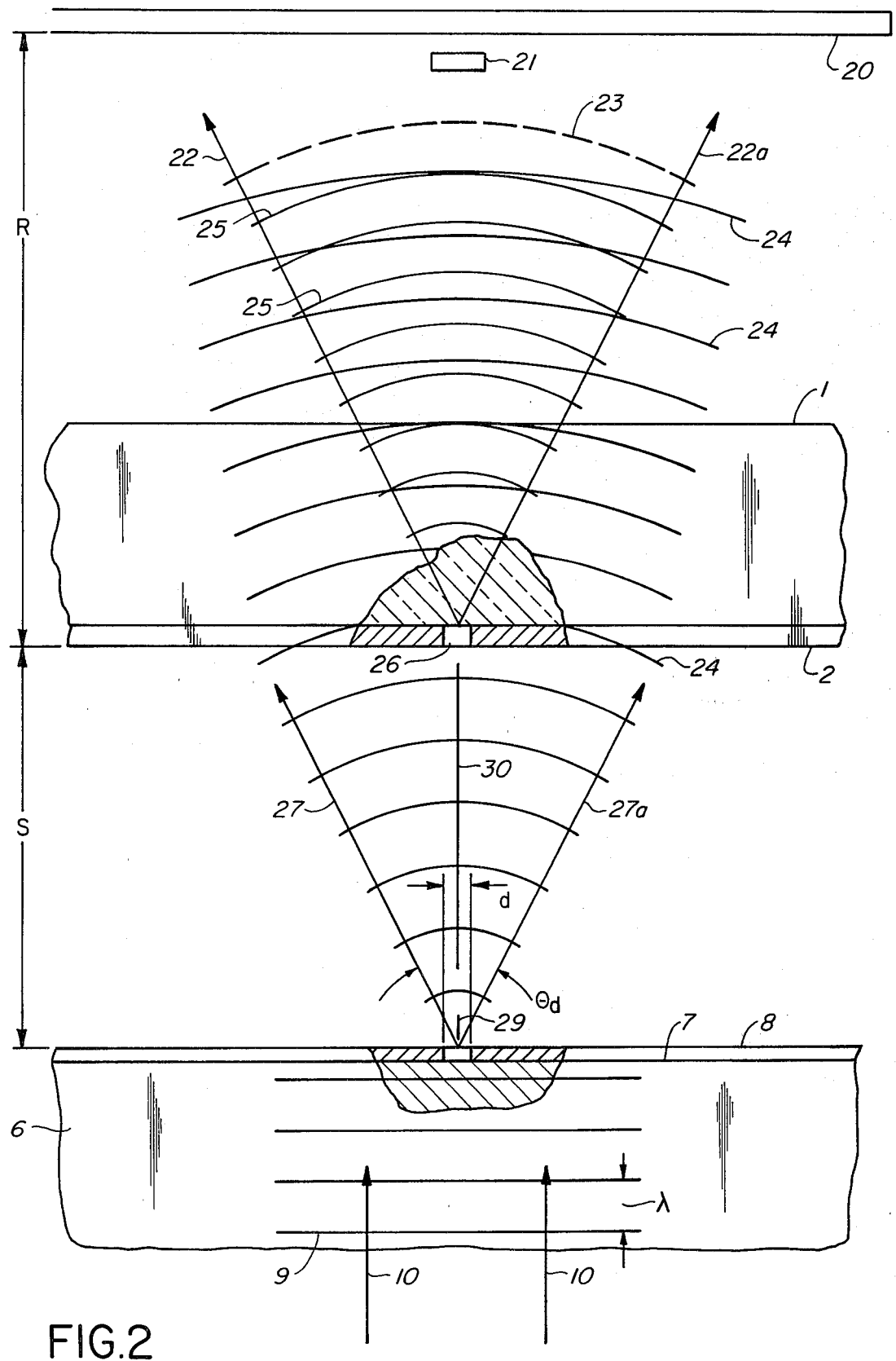
FIGS. 2 and 3 are diagramatic representations of one embodiment of the invention

The seat of some of the problems associated with prior optical microscope methods of mask alignment can be understood from FIG. 2 by considering in detail the diffraction of light from small index or fiducial marks in the form of cooperating pin holes in both the mask 8 and the substrates resist 2. As the dimension of the pin hole 29 is decreased to the order of one wave length of the illuminating light, the divergence angle $\theta_d$ of light transmitted through the hole 29 of diameter d increases rapidly:

$$\theta_d = C\lambda/d, \tag{2}$$

where C is a constant that depends on the actual shape of hole 29. The angle $\theta_d$ defined by the border rays 27, 27a itself defines the envelope of the light and may be developed from known field approximations valid only for distances beyond $d^2/\lambda$ from hole 29.

As in FIG. 1, FIG. 2 shows a coherent visible light ray of wave length λ propagating through a mask 8, which now has a pin hole index marker 29 formed at surface 7 in a thin chromium layer 8. At a distance S above surface 7 is a substrate 1 supporting a conventional resist layer 2 including a second centrally disposed pin hole fiduciary or index mark 26. Now, if pin hole 29 is to be imaged through a microscope objective lens, the diffracted light must be collected by that objective lens. The large angle $\theta_d$ quite clearly would require a small numerical aperture lens and a correspondingly short working distance. Substrate 1 being transparent, the substrate pin hole 26 is in effect viewed at the same time that the mask pin hole 29 is observed.

Alignment in FIG. 2, which is in partial cross section, is successfully achieved when the image of the mask pin hole 29 is centered on the resist layer 2 about the perpendicular line 30 drawn through the center of the substrate resist pin hole 26. But this situation would require that both pin holes can be in focus simultaneously, a physical impossibility if the mask-to-substrate spacing S is appreciably greater than $d^2/\lambda$, which is in practice only a few wavelengths of light on the scale being discussed.

OPTICAL ALIGNMENT OF MASKS USING INTERFERENCE METHODS

The foregoing quandry is eliminated in the present invention by not collecting the diffracted light by a conventional lens to form images; instead, the light diffracted by both of the pin holes 29, 26 is allowed to interfere on a screen 20 and the consequent interference pattern is then visually examined, for example, to determine the relative positions of the pin holes. The interference pattern may alternatively be examined by a mechanically scanned photodetector 21. As seen in FIG. 2, the collimated wave 9, 10 illuminates pin hole 29 and the consequent diverging beam 27, 27a progresses to the substrate 1. According to the invention, some of the diverging beam 27, 27a passes on through substrate 1 toward screen 20, as represented by wave fronts 24. The wave fronts 25 are generated by diffraction at pin hole 26 and flow generally between boundaries 22, 22a. The wave fronts 24, 25 progressively interfere, forming interference lobes represented schematically at 23 as they approach the viewing screen 20, which screen may be reflective or translucent, as desired.

Although FIG. 2 is drawn for transmitted light, it will be clear to those skilled in the art that pin holes 26, 29 in the respective layers 2, 8 may instead be replaced by simple round reflective disks of the same diameter as the original pin holes. It will further be understood that both the pin hole and reflective dot fiduciary markers scatter light in both forward and backward directions, so that the alignment operation can be made by observing either forward or backward scattered light. Furthermore, an opaque disk, whether absorbing or reflecting, will in general scatter diffracted waves both forward and backward and either situation may be exploited.

Figure 3:
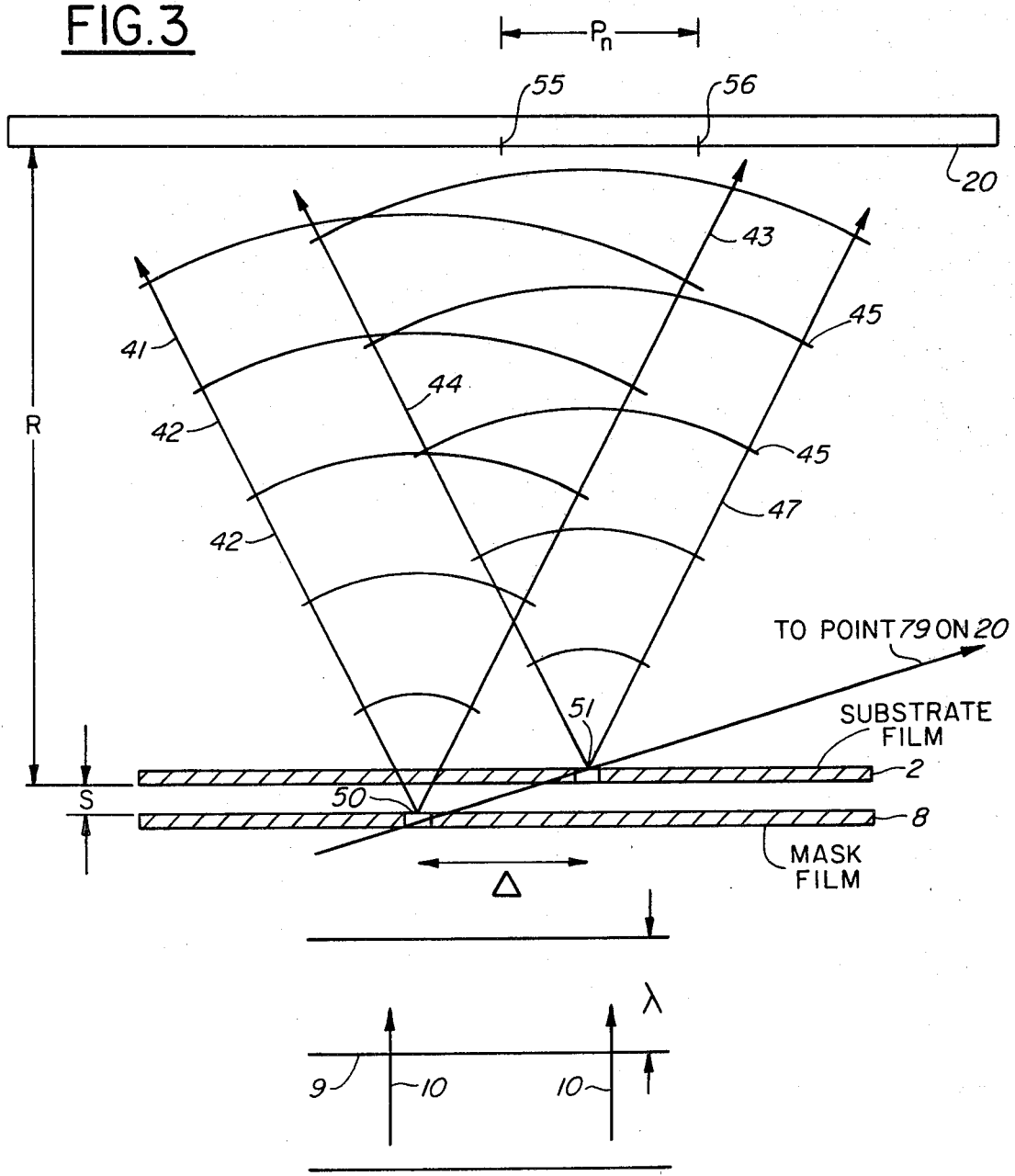

With respect to FIG. 3, it may be shown how the invention uses interference of the aforementioned scattered optical fields for practicing alignment with the desired sub-micron accuracy. In FIG. 3, the previously discussed substrate film 2 with a pin hole 51 is shown, as well as the previously discussed mask film 8 with its pin hole 50 displaced (horizontally in the drawing) by a distance Δ with respect to pin hole 51. The collimated beam 9, 10 is again used to illuminate both pin holes 50, 51 and screen 20 is used to receive the consequent interference pattern thereon. The pattern is the result of interference between wave fronts such as front 41 between boundaries 41, 43 and wave fronts such as 45 between boundaries 44, 47; these are associated with the respective pin holes 50, 51.

In order for the light from the two scattering sources 50, 51 to interfere with good contrast on the viewing face of screen 20 of FIG. 3 or at the detector 21 (FIG. 2), their radiation fields must have mutual coherence (they must come from the same light source), and they should preferably individually have nearly equal amplitudes when otherwise not disturbing each other at screen 20. This is readily accomplished by selecting the transmittance $T_S$ of the surface film 2 in FIG. 1 of substrate 1 so as to insure the same or substantially the same intensity of the two interfering scattered films. Analagously, it will be seen that in the reflection mode, it is the reflectivity of the two reflecting dots, which may also readily be adjusted, that is the determining factor. For the condition that $$d^2 < S\lambda, \tag{3}$$

the relationship among the significant geometric and optical quantities is:

$$T_S = d^4/(SC\lambda)^2, \tag{4}$$

$T_S$, S, $\lambda$, d, and C have previously been defined as:
 $T_S$ = transmittance of substrate film 2,
 d = diameter of each equal pin hole 50, 51,
 S = the effective distance between substrate film 2 and the mask film 8, which remains about 3 microns or less, and
 C = a constant which, for a small round pin hole, is substantially 2.44.

It is to be noted that Equation (4) is an approximation, in that it neglects the small effect of the substrate pin hole 51 on the mask pin hole 50 radiation field. However, the effect is small for small round pin holes and can be compensated by slight empirical adjustments of the transmittance $T_S$.

In the situation of FIG. 3, the interference pattern on the screen is a series of circular rings whose successive spacings depend upon the effective separation S between substrate film 2 and mask film 8. The rings are centered at a point 79 on screen 20 substantially on an axis drawn through the centers of pin holes 50, 51 (which, of course, lie substantially in the same plane). Point 79 on screen 20 lies at the intercept of a straight line drawn from points located at the centers of pin holes 50, 51. For small round pin holes, the pattern intensity on screen 20 is substantially independent of the direction of the incoming light rays 9, 10. In view of the foregoing considerations, it may readily be shown that the several radii (FIG. 10) of the successive interference rings are determined by:

$$r_n = R \tan\left[\cos^{-1}\left(1 - \frac{n\lambda}{2S}\right)\right] \tag{5}$$

where n is an integer. Equation (5) is valid for:

$$n\lambda < 2S \tag{6}$$

and $$R >> S, \tag{7}$$

which inequalities are usually representative of the practical cases. Equation (5) may be simplified where the separation $\Delta$ between pin holes 50, 51 in FIG. 3 is small:

$$r_n = R(n\lambda/S)^{-\frac{1}{2}} \tag{8}$$

The integer n specifies the in phase or out of phase condition (bright or dark condition) of the successive rings on screen 20. The even values of the integer n specify annular rings of radii such that the radiation in those rings is in phase with the falling at the rings' central point 79. Odd values of the integer n define an array of annular rings of radii such that the radiation in any of the rings is substantially 180 degrees out of phase with that incident at the central point 79.

To minimize any possibilities of damage in the operating process to either the mask 8 or the substrate film 2, the initial step in mask alignment using the concepts of FIG. 3 will be performed with a separation S therebetween of about 30 microns, for example, in which case, there would be several annular rings visible on screen 20 in a typical geometry. However, if mask 8 were then to be moved toward contact with substrate film 2 so that S approaches zero, fewer and fewer interference rings would be formed on screen 20, as is predicted by Equation (8); when substantial contact between elements 2, 8 is made, no interference rings are formed. The pattern on screen 20 of pin holes 50, 51 when actually aligned horizontally and in substantial contact is therefore simply the diffraction pattern of a single such hole. It is the bright field of a Gaussian intensity distribution characteristic of small pin holes where $d \leq \lambda$. Now, if holes 50, 51 are separated by a distance $\Delta$ by translating one or the other of the semitransparent elements 2, 8 horizontally, the generally uniform Gaussian intensity distribution will break up into an array of parallel equally-spaced bright lines. The uniform lines are each perpendicular to the plane of the drawing and the ring position $P_n$ at 56 on a screen 20 at distance R from pin holes 50, 51 is given by the relation:

$$P_n = R \tan\left(\sin^{-1}\frac{n\lambda}{\Delta}\right), \tag{9}$$

for $R >> \Delta$, which is the normal situation. For conditions in which the lateral displacement $\Delta$ is several wave lengths of light, Equation (9) readily reduces to:

$$P_n = Rn\lambda/\Delta \tag{10}$$

Equation (4) for determining the optimum transmittance $T_S$ was shown to hold only for mask-to-substrate separations S equal to the finite values of $d^2/\lambda$ discussed with respect to FIG. 2. It does not apply in the instance of the displaced pin holes 50, 51 where elements 2, 8 are substantially in contact (S→0) which is the condition under consideration in FIG. 3. In the FIG. 3 situation, the interfering diffracted light levels must substantially equal each other and must be well above the intensity the light directly transmitted by the collimated beam 9, 10 toward the viewing face of screen 20. The directly transmitted light beam 9, 10 is from a large aperture source; it remains collimated, and most of it is spatially separated from that diffracted by pin holes 50, 51. Furthermore, the collimated light beam 9, 10 is significantly attenuated upon passing through each of the two semi-transparent screens (the mask 8 and the substrate film 2) containing the respective pin holes 50, 51. An optical density corresponding to $T_S = 0.1$ results in a strong scattered or diffracted wave emanating from pin hole 50, for example, without undue attenuation by the material of substrate film 2. Use of greater values of $T_S$ would not increase the intensity of the scattered wave 41, 42, 43 sufficiently to justify the consequent loss of light energy when passing through substrate film 2.

These arrangements for the optical alignment of masks by use of optical interference methods may be extended considerably. The use of a pair of side-by-side diffracting pin hole elements to generate overlapping spherical interfering wave fronts may be extended, for example, to the use of a pair of narrow slits. Here, the diffraction spreading will be restricted to spreading perpendicular to the axes of the slits. Arrays of pairs of pin holes or of pairs of slits may be used, the pairs being randomly distributed or so widely separated as to prohibit visible interference between adjacent pairs. Other patterns, such as similarly situated pairs of curved slits or annuli may also be used.

OPTICAL ALIGNMENT OF MASKS USING FRESNEL ZONE PLATES AND INTERFERENCE METHODS

Figure 4:
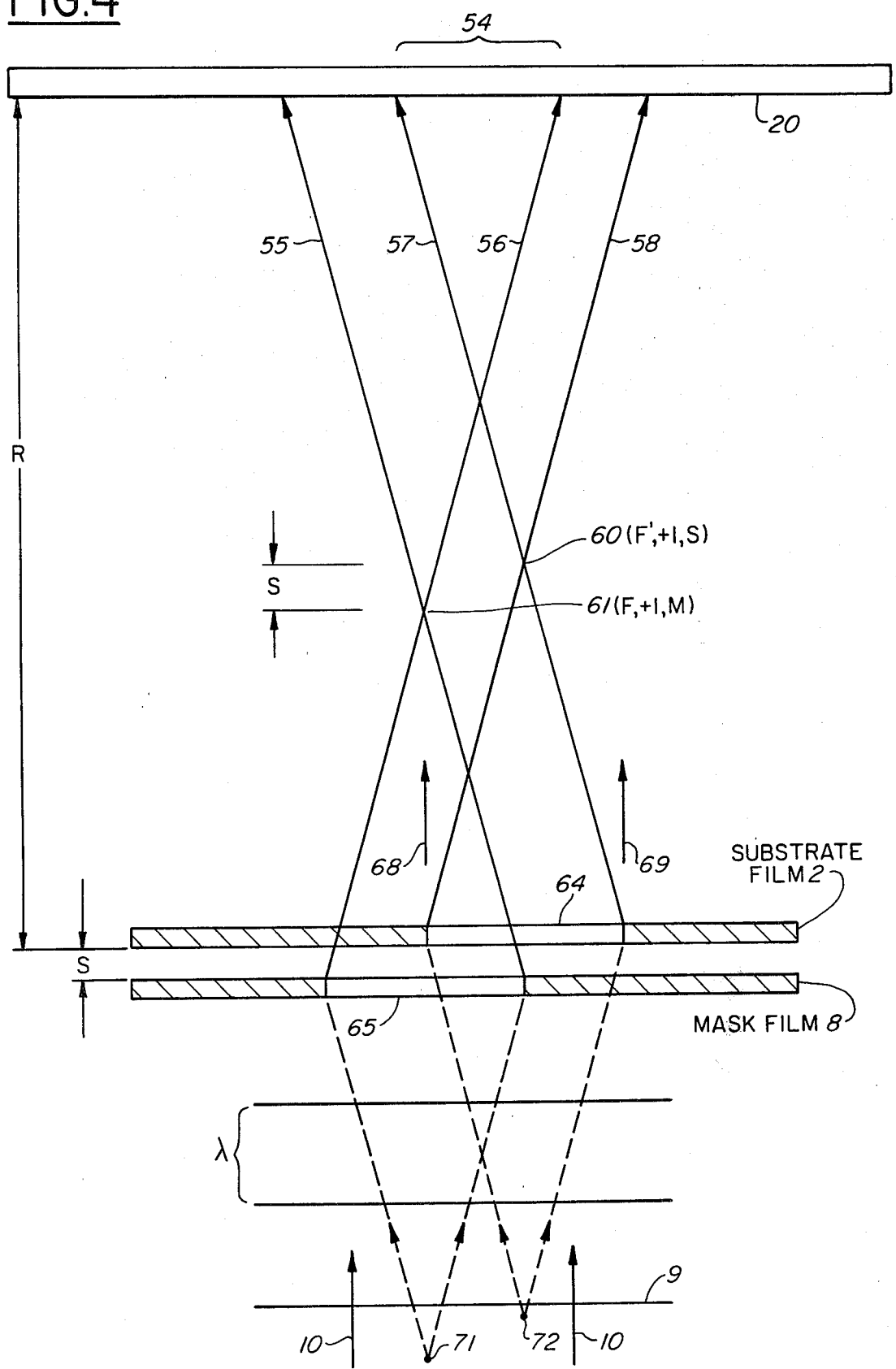
FIG. 4 is a diagramatic representation of a second embodiment of the invention.

A preferred embodiment of the invention is illustrated in FIGS. 4, 5 and 6; in this device, very efficient use of the available illumination is made by arranging concentrically disposed diffracting rings in place of each of the aforementioned pin holes, both of which are generically optically diffracting apertures. Each of the sets of opaque diffracting rings is fabricated to make up a conventional Fresnel half-period zone plate. That the Fresnel zone plate has focal properties similar to those of a lens is well known in optics, as taught in the classical book by R. W. Wood: *Physical Optics*, McMillan Company, 1921, pages 38 through 40 and in F. A. Jenkins, H. E. White, *Fundamentals of Optics*, McGraw-Hill, 1950, pages 378 through 387. Although the alternating transparent and opaque rings of the zone plate represent a moderately complex pattern, the complete focusing elements are readily reproduced on substrate 2 and on mask 8 by conventional methods as are used to form the pin holes 50, 51 previously discussed. To use the Fresnel zone plates for mask alignment purposes, a pair of them is replicated, one in the mask film 8 at 65 and one at 64 in the substrate film 2, as shown in FIG. 4. As in FIG. 3, it is being assumed in FIGS. 4, 5, and 6 merely for convenience in making the drawings clear, that films 2, 8 are supported as in FIGS. 1 and 2, for example. It will also be understood that the multiple zone plate rings shown in FIG. 5A are not shown in the Fresnel devices 64 and 65 of FIGS. 5 and 6 merely as a matter of convenience and for the purpose of rendering the drawings clear. The zone plates 64 and 65 are identified in FIGS. 5 and 6 simply as disks with respective centers 66, 67, through which centers passes the alignment axis 84.

Fresnel zone plate 65 in FIGS. 4, 5, and 6 will focus a major part of the illuminating beam 9, 10 at several points in space depending upon the exact design of the zone plates, the degree of collimation of the illumination, and the wave length of the light. If the mask zone plate 65 is illuminated by the collimated beam 9, 10 of a laser, for example, most of the light passing through zone plate 65 will be concentrated into three beams. One such beam, suggested in FIG. 4 by the parallel arrows 68, 69 is the zero order beam and is parallel and of necessity focussed at infinity. The other two order $\pm 1$ beams are coincident and focus at the F points 61 and 71. Other light from zone plate 65 is focussed at other points, but is comparatively weak enough to be neglected. With a second Fresnel zone plate 64 placed in the substrate film 2 in series with zone plate 65 as in FIG. 4, seven light beams are generated, three focused at infinity and the other four focused at equal focal distances $\pm F$ and $\pm F'$ found at the respective points 60, 61, 71, 72. The vertical component of separation between the focal points 60 and 61 is equal to the separation S between films 2 and 8, as is the vertical separation between points 71, 72. The two spherical waves generated cooperatively by zone plates 64, 65 interfere above film 2 to form at screen 20 the same general kind of viewable interference pattern as is produced by pin holes 50, 51. The light diffracted by the foci 60, 61 interferes at screen 20 in the same general way as does that of the light from pin holes 50, 51.

The zero order diffraction characteristic of a pair of Fresnel zone plates 64, 65 may advantageously be used for coarse alignment of the mask and substrate; for this purpose, the system is illuminated by weakly converging light as in FIG. 5 which focuses to a point on the observation screen 20. When the zero-order spot is focused on screen 20 by the insertion of thin lens 85 (FIG. 6), it is apparent that the light beam is actually three beams, as shown in FIG. 6, because three focal spots 81, 82, 83 are generated on screen 20. The reason for the existence of the outermost two (81, 83) of the three spots can be explained in terms of the sum of the interactions of the $+1$ order focal point of zone plate 65 of the mask with the $-1$ order focal point of the zone plate 64 of the substrate and vice versa, with the central focal spot 82 being undiffracted, since spot 82 is generated from the zero-order focal points of the cooperating zone plates 64, 65.

In the corresponding successive views of FIGS. 7 through 10, it will be understood that the observer is looking upward as in FIG. 6 toward the apparatus so that the bottoms of elements 85, 65, 64, and screen 20 are viewed. In other words, the observed bottom planes in FIG. 6 of lens 85, zone plates 65, 64, and of screen 20 are shown as substantially parallel. Operation is initiated by achieving coarse alignment of the respective mask and substrate zone plates 65, 64 preferably by moving the zone plate 65 and its mask with respect to the substrate of zone plate 64; this implies relative vertical motion in FIG. 6. For example, the mask zone plate 65 is moved horizontally in FIG. 6 parallel to index line 80 with respect to the substrate zone plate 64 until focal points 81, 82, 83 and point 79 coalesce. As the three points of light tend to merge along axis 80, the fringe pattern of light from the focal points 60, 61 of FIG. 5 broaden as the foci are aligned, just as in the case of the merging of the pin holes 50, 51 of FIG. 3. The respective F and F' focal points 60, 61 71, 72 act desirably as virtual pin holes disposed by the focal distance above and below the individual planes of their respective Fresnel zone plates 64, 65.

Figure 7:
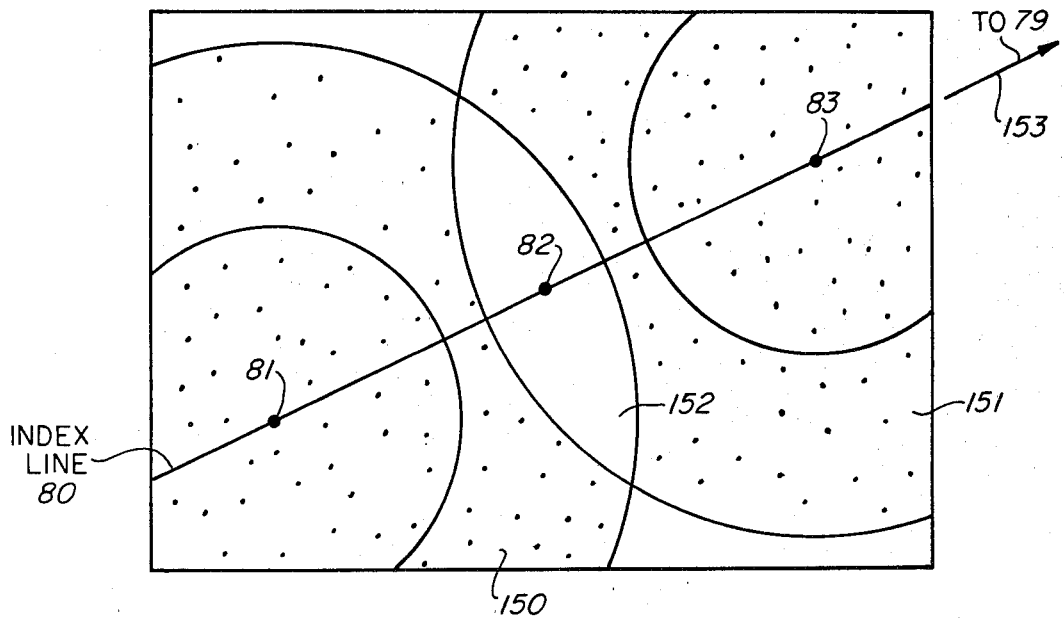
FIGS. 7 through 10 are views of displays produced in a further mode of operation of the invention.

The index line 80, as seen in FIG. 7, will not in general be disposed at a particular angle to the sides of screen 20; in practice the apparatus of FIG. 13 will be used to rotate index line 80 so that it is horizontal in FIG. 7, for example. The index line 80 is defined by the intersection with the surface of screen 20 of the plane containing the zero order beams 81, 82, 83, the centers 66, 67 of the misaligned zone plates 64, 65, and their respective focal points and the center of interference rings at 79. The alignment axis 84 also intersects index line 80. The intersection on the screen 20 of the spot of undiffracted light at point 82 is always fixed.

FIGS. 7 through 10 illustrate the usual progression of interference patterns seen on screen 20 during the successive alignment steps. In FIG. 7, for example, alignment is quite incomplete, but the points 81, 82, 83 are in equally spaced disposition along index line 80. The optical axis 84 intersects the index line 80 at point 79 far to the right of the figure, as indicated by arrow 153. The stippled circular areas 150, 151 centered on the respective points 81, 83 represent bright areas except in the overlap area 152; in area 152, there are many fringe circles crossing at right angles to index line 80, circles centered on point 79, and these are jammed together so as to be very fine as generally described by Equation (9). On the other hand, the pattern of FIG. 7 is characteristic of the situation in which the Fresnel zones must be moved one relative to the other so that points 81 and 83 move toward the fixed point 82.

Figure 8:
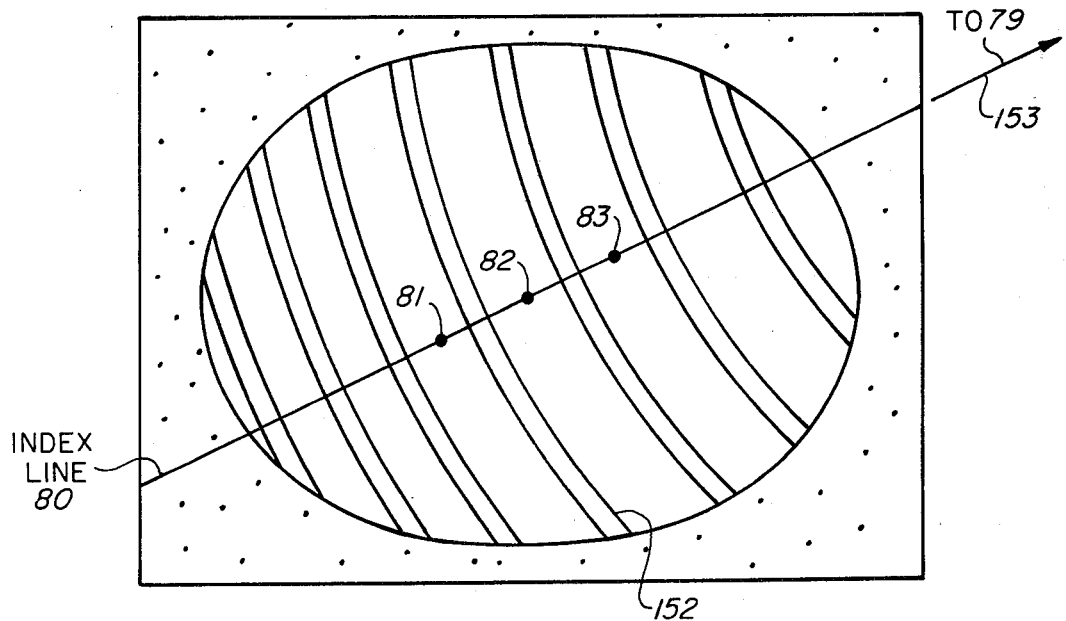
Figure 11:
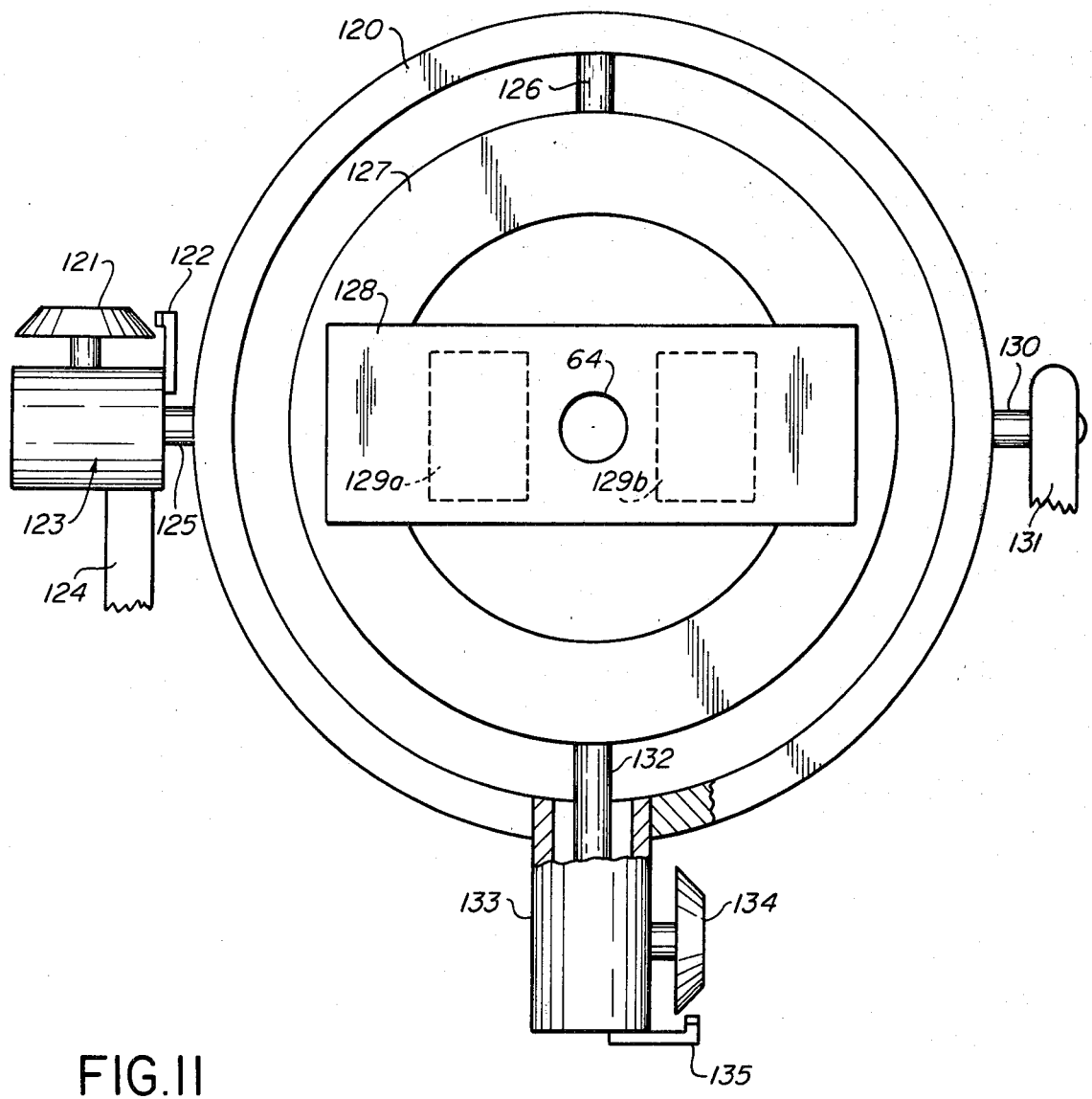
FIG. 11 is a plan view of a mechanism for rolling the zone plate 64 and substrate 128 about substantially horizontal x or y axes.

Taking the latter action by operation of manipulators such as those of FIGS. 11, 12, and 13 will also begin to move the axis 84 and point 79 in along index line 80 toward fixed point 82 and will produce a pattern like that of FIG. 8. Here, the alignment axis 84 and point 79 have not come into view on screen 20 as is indicated by the continued presence of arrow 153, but it is clear that the points 81 and 83 have been brought equally nearer to fixed point 82. The several dark arcs, such as arc 152, are formed by interference between light beams within the envelopes 55, 56 and 57, 58 of FIG. 4 and corresponding to areas 150 and 151 of FIG. 7 associated with points 81, 82, 83 and are now easily broad enough to resolve. They fill most of screen 20, so that the adjustment has in essence expanded the area 152 of FIG. 7. Characteristic of the FIG. 8 display is the information that the relative separation on zone plates 64 and 65 is still too large.

Figure 9:
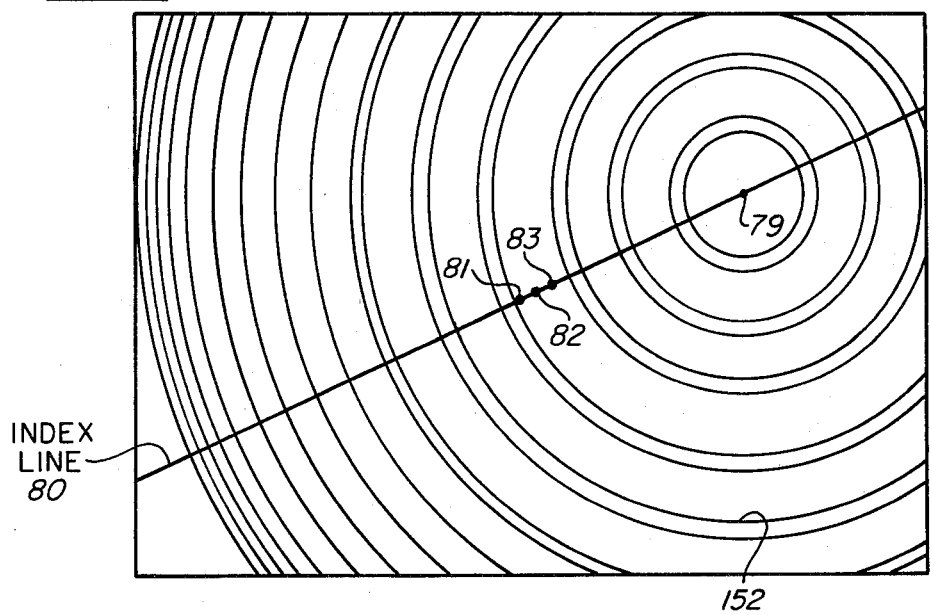

Continuing the same corrective operation of the manipulation, as seen in FIG. 9, moves points 81 and 83 much closer to the fixed point 82. Also, the alignment axis 84 intersection with index line 80 moves in so closely that that intersection and point 79 on screen 20 nearly merge, indicating that perfect alignment of zone plates 64, 65 has almost been achieved. The characteristic bull's eye pattern of FIG. 9, always with its center at point 79, appears when such proximity to correct alignment comes about. Continued relative motion of zone plates 64, 65 parallel to index line 80, as before, causes points 81, 82, 83, and 79 to coalesce. Ultimately, when all of the points 79, 81, 82, 83 coalesce at the central point of screen 20 (point 82 which does not move) perfect alignment of zone plates 64, 65 has been achieved, all of those points coinciding at the center of the then circularly symmetric bull's eye pattern.

Figure 10:
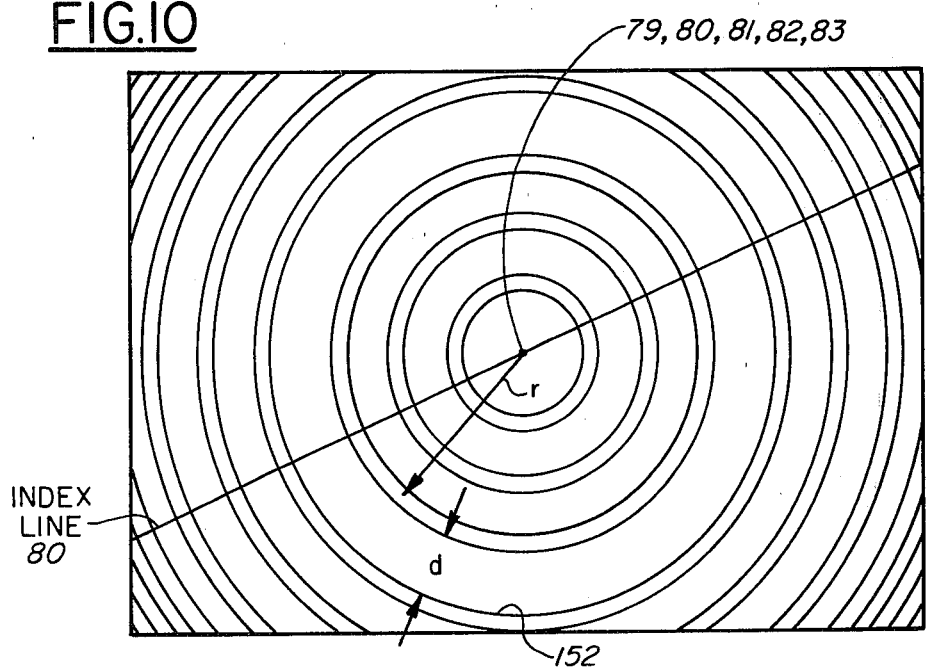

The radii of the successive fringes in FIG. 10, as well as the distances d between fringes, is a strong function of the separation S (FIG. 5) of the mask and substrate zone plates 65 and 64. The radius r for the n'th fringe and its separation from the next adjacent fringe are both large when the separation S is small; thus, as S approaches zero, fewer but more widely separated fringes are visible on screen 20.

It will be understood by those skilled in the art that various available mechanical manipulator devices may be used to enable movement of lens 85 and of zone plates 64 and 65 in the desired manner. For example, the conventional manipulator stages often used in microscopes may be found readily suitable. The invention may also be instrumented by employing the positional control configurations of the James B. Thaxter U.S. Pat. No. 4,195,243, issued Mar. 25, 1980 for "Piezoelectric Wafer Mover", and assigned to Sperry Corporation. In that invention apparatus is provided which effects movement of an object such as a substrate wafer by means of a predetermined potential difference applied to a transducer frictionally coupled to the object.

So that lens 85 in FIG. 6 may be inserted and adjusted in position along axis 86, the micrometer 95 in FIG. 12 is supported by yoke 96 from the base of the apparatus, micrometer 95 having a calibrated dial 98 and cooperating index 97. The lens 85 is held in lens holder 87 supported by slip joint 88, 89 from the micrometer output shaft 90.

So that substrate 128 and its associated zone plate 64 and transfer regions 129a, 129b may be properly placed in angle in FIG. 6 with respect to the x and y axes, substrate 128 is mounted on a mounting face of a gimbal ring 127 as shown in FIG. 11. Ring 127 is journalled in a bearing at shaft 126 in the conventional manner; it is also journalled in a conventional micrometer device 133 having a dial 134 calibrated in angle about the y axis and a cooperating index 135.

Gimbal ring 120, in which shafts 126 and 132 are journalled, is journalled, in turn, in shafts 125, 130 disposed in a generally conventional manner at right angles to shafts 126, 132. Shaft 130 is journalled in a yoke 131 affixed to the base of the apparatus. Shaft 125 is joined to the conventional rotatable element of micrometer 123. The latter is equipped with a dial 121 calibrated in angle and cooperating with index 122. The stator of micrometer 123 is again supported by a yoke 124 from the apparatus base.

So that mask 99, its cooperating zone plate 65, and the active parts 99a, 99b of the mask may be adjusted in x, y, and θ, the apparatus of FIG. 13 may be used. On an apertured supported base element 100 of the apparatus is a generally concentric movable apertured stage 110 which may be spaced from the face of base element 100 by three cooperating hemispherical bearings 111, 112, 113 in a generally conventional manner. For controlling relative motion between plates 100, 110, four micrometer devices 103, 103a, 103b, 103c are provided. With respect to micrometer device 103, the latter is equipped with a dial 104 and cooperating index 108. The stator of micrometer 103 is pivoted at 102 from boss 101 affixed to plate 100. The rotor portion of micrometer 103 is linked by pivot 105 to a linkage 106, itself affixed at 107 to the upper surface of stage 110. Operation of micrometer 103 when dial 104 is turned is to cause an increase or a decrease of the distance between pivots 102, 105. The opposite pairs of micrometers 103, 103a, 103b, and 103c of FIG. 11 provide the possibility of rotation or of translation of the stage 110 on which mask 99 is located. If all four micrometers are extended (opposite pairs in opposite directions), mask 99 is rotated. If micrometer 103 is extended and its opposite companion 103b is contracted, mask 99 moves to the right, et cetera. Small angles of rotation and small translations are assumed in the usual case. In FIGS. 9, 10, and 11, the several micrometer devices may be equipped with conventional friction brakes so that each shaft remains in the position at which it is set until readjusted.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. Apparatus for aligning a first planar optically transparent element with respect to a second planar optically transparent element disposed in substantially parallel relation comprising:
   first and second thin films affixed to major adjacent surfaces of said first and second planar elements respectively,
      said films being provided with first and second apertures respectively, each of said apertures containing a Fresnel zone plate,
   means for illuminating said Fresnel zone plate with collimated light, and
   means for viewing an interference pattern formed by light passing through said Fresnel zone plates.

2. Apparatus as described in claim 1 wherein light transmittance of said second thin film is selected such that light passing through said second thin film, and light passing through said Fresnel zone plate contained in said second aperture have substantially equal intensities at said viewing means.

3. Apparatus as described in claim 2 where light transmittance $T_S$ of said second thin film is substantially:

$$T_S = d^4/(SC\lambda)^2$$

where:
   d = diameters of said apertures,
   s = effective distance between said first and second thin films, and
   c = a constant empirically dependent upon geometry of said apertures.

4. Apparatus as described in claim 3 where $T_S = 0.1$.

5. Apparatus as described in claim 2 additionally including means for parallel relative translation between said first and second planar elements.

6. Apparatus as described in claim 5 additionally including means for relative rotation between said first and second planar elements about an axis substantially perpendicular to said first and second planar elements.

7. Apparatus as described in claim 6 additionally including means for relative translation between said first and second planar elements along an axis substantially perpendicular to said first and second planar elements.

8. Apparatus as described in claim 7 wherein said apparatus is arranged such that circular interference rings are formed at said viewing means about a center lying on a line joining centers of said Fresnel zone plates.

9. Apparatus as described in claim 8 additionally including means for weakly converging said collimated light prior to incidence on said Fresnel zone plates.

* * * * *